(12) United States Patent
Kitano

(10) Patent No.: US 10,971,591 B2
(45) Date of Patent: Apr. 6, 2021

(54) POWER SEMICONDUCTOR DEVICE

(71) Applicant: Mitsubishi Electric Corporation, Tokyo (JP)

(72) Inventor: Dai Kitano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/444,775

(22) Filed: Jun. 18, 2019

(65) Prior Publication Data
US 2020/0066860 A1 Feb. 27, 2020

(30) Foreign Application Priority Data

Aug. 23, 2018 (JP) .............................. JP2018-155920

(51) Int. Cl.
| | | |
|---|---|---|
| *H01L 29/45* | (2006.01) | |
| *H01L 29/739* | (2006.01) | |
| *H01L 29/417* | (2006.01) | |
| *H01L 29/06* | (2006.01) | |

(52) U.S. Cl.
CPC ........ *H01L 29/45* (2013.01); *H01L 29/41741* (2013.01); *H01L 29/7397* (2013.01); *H01L 29/0696* (2013.01)

(58) Field of Classification Search
CPC ............... H01L 29/45; H01L 29/41741; H01L 29/7397; H01L 29/0696
See application file for complete search history.

(56) References Cited

U.S. PATENT DOCUMENTS

| | | | | |
|---|---|---|---|---|
| 6,380,622 B1* | 4/2002 | Hirai | ...................... | H01L 24/72 |
| | | | | 257/618 |
| 2019/0157346 A1* | 5/2019 | Lee | ...................... | G06F 3/0673 |
| 2019/0386133 A1* | 12/2019 | Boianceanu | .......... | H01L 29/407 |

FOREIGN PATENT DOCUMENTS

JP   2011-249491 A   12/2011

* cited by examiner

*Primary Examiner* — Marc Anthony Armand
(74) *Attorney, Agent, or Firm* — Studebaker & Brackett PC

(57) ABSTRACT

Provided is a power semiconductor device that prevents element breakage, thus improving its reliability. The power semiconductor device includes a first main electrode. The first main electrode includes a first metal film, an intermediate film, and a second metal film. The first and second metal films are made of metal having an Al concentration greater than or equal to 95 wt %. The intermediate film contains primary-constituent phases each formed of a metal compound, and contains a secondary-constituent phase formed of an iron group element. The metal compound is that of at least one kind of element selected from a group consisting of a group 4A element, a group 5A element, and a group 6A element, and at least one kind of element selected from a group consisting of C and N. The intermediate film has a higher degree of hardness than the second metal film.

4 Claims, 5 Drawing Sheets

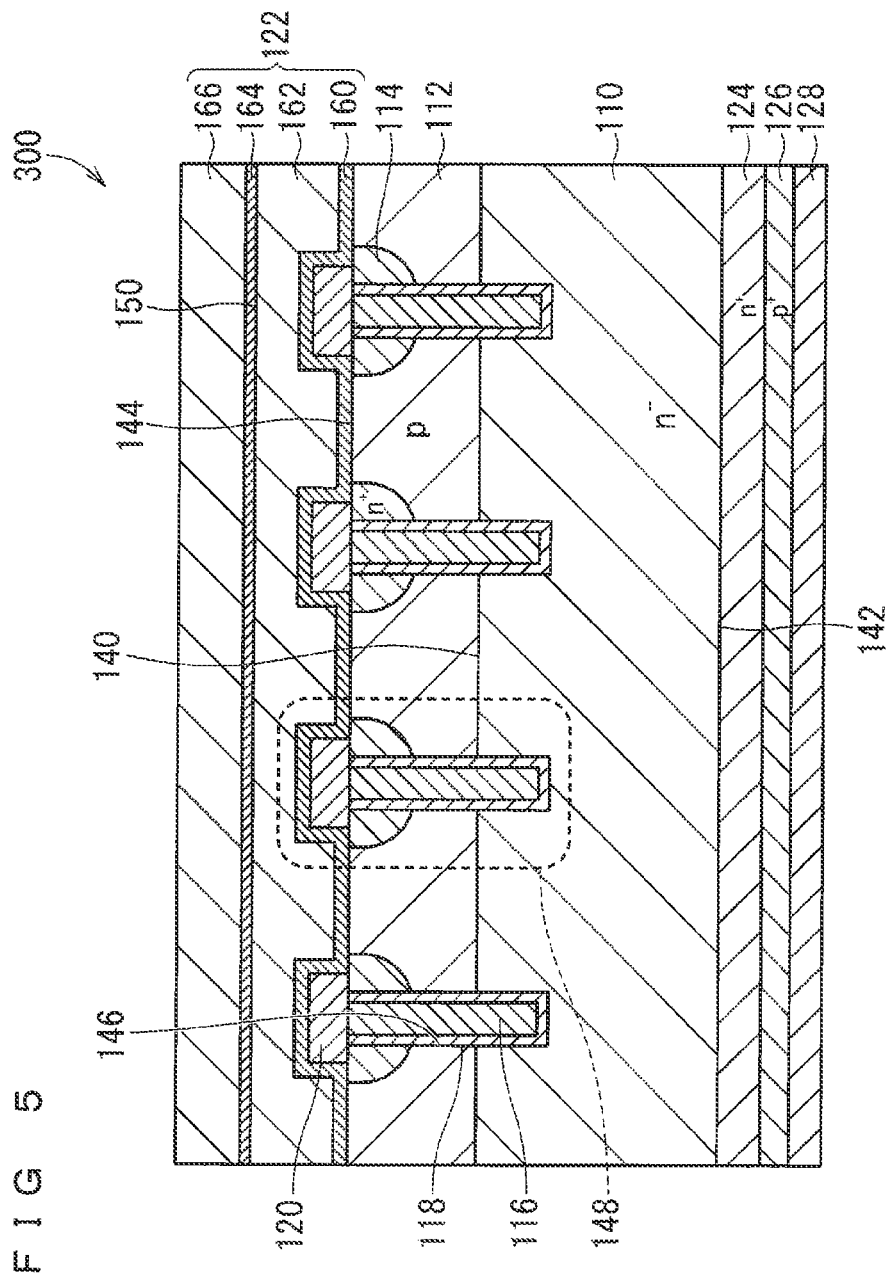

POWER SEMICONDUCTOR DEVICE

BACKGROUND OF THE INVENTION

Field of the Invention

The present invention relates to power semiconductor devices.

Description of the Background Art

A vertical power semiconductor device includes a semiconductor substrate, a plurality of cell regions, and a main electrode. The cell regions are disposed on a main surface of the semiconductor substrate. The main electrode is disposed aver the cell regions.

In some cases, a wire is connected to the main electrode through ultrasonic bonding. In other cases, an outer lead is directly welded to the main electrode with pressure, or is soldered to the main electrode. Such a conventional vertical power semiconductor device, which has steps in the cell regions, can exhibit element breakage when the wire, the outer lead, or the like is connected. For instance, when the wire is connected through ultrasonic bonding, the main electrode can be deformed, thus destroying an element in the cell regions, such as an interlayer insulating film, or the like. Moreover, an element can be destroyed by a thermal stress when the outer lead is connected through pressure welding or soldering.

Japanese Patent Application Laid-Open No. 2011-249491 describes a vertical power semiconductor device that includes an emitter electrode over a plurality of cell regions (c.f., paragraphs 0012 and 0020). The emitter electrode has a barrier metal film, a first metal film, a high-strength metal film, and a second metal film (c.f., paragraph 0013). The first and second metal films are made of metal containing greater than or equal to 95% Al (c.f., paragraph 0013). The barrier metal film and the high-strength metal film are each formed of high-melting metal (e.g., Ti, W, Mo, V) or a conductive compound of high-melting metal (c.f., paragraph 0013). The high-strength metal film is stronger than the second metal film (c.f., paragraph 0013). The vertical power semiconductor device in Japanese Patent Application Laid-Open No. 2011-249491, which includes the high-strength metal film stronger than the second film, prevents a deformation in the first metal film and reduces the damage to the element in the cell regions, such as an interlayer insulating film, if the second metal film is deformed in the wire connection to the emitter electrode through ultrasonic bonding (c.f., paragraph 0015). This avoids element breakage that occurs when the wire is connected to the emitter electrode through ultrasonic bonding (c.f., paragraph 0015), and also avoids element breakage that occurs when the outer lead is directly welded to the emitter electrode with pressure, or is soldered to the emitter electrode (c.f., paragraph 0015).

The vertical power semiconductor device described in Japanese Patent Application Laid-Open No. 2011-249491 somewhat prevents the element breakage that occurs, for example, when the wire is connected to the emitter electrode through ultrasonic bonding, or when the outer lead is directly welded to the emitter electrode with pressure, or is soldered to the emitter electrode. However, this vertical power semiconductor device, which includes the high-strength metal film having low hardness, fails to sufficiently prevent a deformation in the high-strength metal film and thus fails to sufficiently prevent a deformation in the first metal film, when the wire connection to the emitter electrode through ultrasonic bonding deforms the second metal film. For this reason, the vertical power semiconductor device fails to sufficiently prevent the element breakage that occurs when the wire is connected to the emitter electrode through ultrasonic bonding. The vertical power semiconductor device also fails to prevent the element breakage that occurs when the outer lead is directly welded to the emitter electrode with pressure, or is soldered to the emitter electrode.

SUMMARY

An object of the present invention is to provide a power semiconductor device that prevents element breakage, thus improving its reliability.

The present invention relates to a power semiconductor device. The power semiconductor device includes a semiconductor substrate, a plurality of cell regions, a first main electrode, and a second main electrode. The semiconductor substrate has a first main surface and a second main surface. The second main surface is disposed opposite the first main surface. The plurality of cell regions are disposed on the first main surface. The first main electrode is disposed over the plurality of cell regions. The second main electrode is disposed above the second main surface. The plurality of cell regions each include a semiconductor layer, a control electrode, and an interlayer insulating film. The semiconductor layer is connected to the first main electrode. The interlayer insulating film covers the control electrode, and electrically insulates the control electrode from the first main electrode. A step is formed between the semiconductor layer and the interlayer insulating film. The first main electrode includes a first metal film, an intermediate film, and a second metal film. The first metal film is disposed over the plurality of cell regions. The intermediate film is disposed on the first metal film. The second metal film is disposed on the intermediate film. The first metal film and the second metal film are made of metal having an Al concentration greater than or equal to 95 wt %. The intermediate film contains primary-constituent phases each formed of a metal compound, and contains a secondary-constituent phase formed of an iron group element. The secondary-constituent phase joins the primary-constituent phases to each other. The metal compound, forming each of the primary-constituent phases, is a metal compound of at least one kind of element selected from a group consisting of a group 4A element, a group 5A element, and a group 6A element on the long-form periodic table, and at least one kind of element selected from a group consisting of C and N. The intermediate film has a higher degree of hardness than the second metal film.

Such a configuration provides a power semiconductor device that prevents element breakage, thus improving its reliability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic cross-sectional view of a power semiconductor device in a third preferred embodiment.

DESCRIPTION OF THE PREFERRED EMBODIMENTS

1 First Preferred Embodiment

1.1 Power Semiconductor Device

Figure 1:
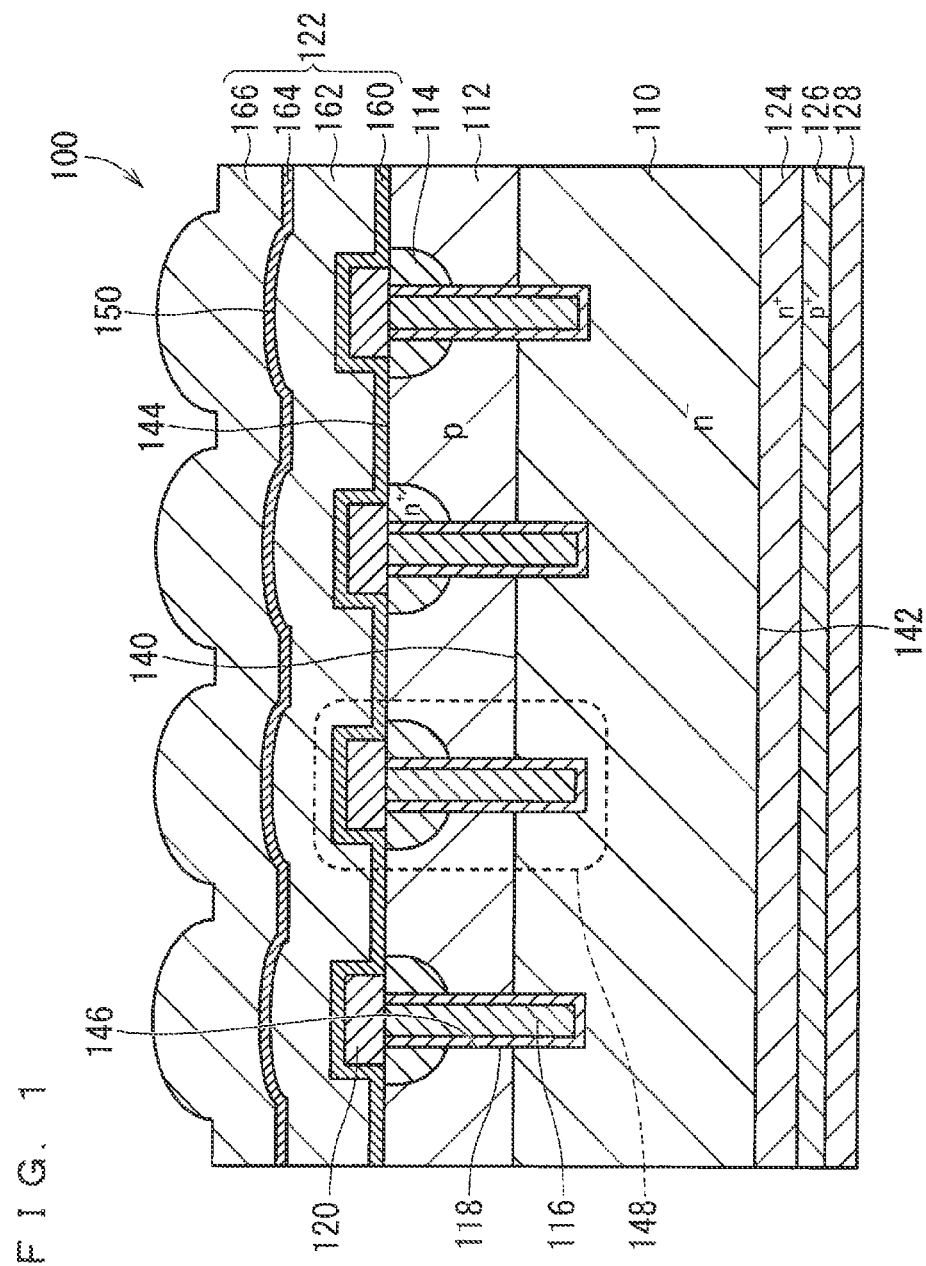
FIG. 1 is a schematic cross-sectional view of a power semiconductor device in a first preferred embodiment.

FIG. 1 is a schematic cross-sectional view of a power semiconductor device in a first preferred embodiment.

A power semiconductor device 100 in FIG. 1 in the first preferred embodiment is a trench insulated-gate bipolar transistor (IGBT).

The power semiconductor device 100 includes a semiconductor substrate 110. In the first preferred embodiment, the semiconductor substrate 110 is an n-type semiconductor substrate, and is made of Si. The semiconductor substrate 110 has a first main surface 140 and a second main surface 142. The second main surface 142 is disposed opposite the first main surface 140.

The power semiconductor device 100 includes a semiconductor layer 112 and a semiconductor layer 114. In the first preferred embodiment, the semiconductor layer 112 is a p-type semiconductor layer, and the semiconductor layer 114 is an $n^+$ semiconductor layer. The semiconductor layer 112 is disposed on the first main surface 140. The semiconductor layer 114 is disposed over a region making up part of an upper surface 144 of the semiconductor layer 112.

The power semiconductor device 100 includes a control electrode 116 and an insulating film 118. In the first preferred embodiment, the control electrode 116 is a gate electrode, and the insulating film 118 is a gate insulating film. The power semiconductor device 100 has trenches 146 each extending through the semiconductor layer 112 and the semiconductor layer 114 to reach the semiconductor substrate 110. The control electrode 116 is buried in the trench 146, and is separated away from the semiconductor layer 112, the semiconductor layer 114, and the semiconductor substrate 110 by the insulating film 118.

The power semiconductor device 100 includes an interlayer insulating film 120. The interlayer insulating film 120 covers the control electrode 116, and electrically insulates the control electrode 116 from a first main electrode 122, which will be described later on.

The power semiconductor device 100 includes a plurality of cell regions 148. The cell regions 148 are disposed on the first main surface 140. Each of the cell regions 148 includes the semiconductor layer 112, the semiconductor layer 114, the control electrode 116, the insulating film 118, the interlayer insulating film 120, and the trench 146. In each cell region 148, there is a step between the semiconductor layers 112 and 114, and the interlayer insulating film 120.

The power semiconductor device 100 includes the first main electrode 122. In the first preferred embodiment, the first main electrode 122 is an emitter electrode. The main electrode 122 is disposed over the cell regions 148. The first main electrode 122 is connected to the semiconductor layer 112 and the semiconductor layer 114.

The first main electrode 122 includes a barrier metal film 160, a first metal film 162, an intermediate film 164, and a second metal film 166. The barrier metal film 160, the first metal film 162, the intermediate film 164, and the second metal film 166 are formed over the cell regions 148 in the order in which they are recited. As such, the first metal film 162 is disposed over the cell regions 148. The intermediate film 164 is disposed on the first metal film 162. The second metal film 166 is disposed on the intermediate film 164. The barrier metal film 160 is disposed between the first metal film 162 and the cell regions 148.

The first metal film 162 and the second metal film 166 are made of metal having an Al concentration greater than or equal to 95 wt %. This makes the first metal film 162 and the second metal film 166 more processable, and more facilitates connection of a wire to the second metal film 166. The "metal" herein may be one of a pure metal and an alloy.

The barrier metal film 160 and the intermediate film 164 each contain primary-constituent phases each formed of a metal compound, and contains a secondary-constituent phase formed of an group element. The secondary-constituent phase joins the primary-constituent phases to each other.

The metal compound, forming the primary-constituent phases, is a metal compound of at least one kind of element selected from a group consisting of a group 4A element, a group 5A element, and a group 6A element on the long-form periodic table, and at least one kind of element selected from a group consisting of C and N. The metal compound, forming the primary-constituent phases, is thus a metal compound of at least one kind of element selected from the group consisting of the group 4A element, the group 5A element, and the group 6A element, and is at least one kind selected from a group consisting of a carbide, a carbonitride, and a nitride. An example of the at least one kind of element selected from the group consisting of the group 4A element, the group 5A element, and the group 6A element is at least one kind of element selected from a group consisting of W, Ti, and Ta.

The iron group element, forming the secondary-constituent phase, is at least one kind of element selected from a group consisting of Fe, Co, and Ni.

The intermediate film 164 is thus made of WC—Co alloy, WC—TiC—Co alloy, WC—TaC—Co alloy, WC—TiC—TaC—Co alloy, WC—Ni—Cr alloy, TiC—TaN—Ni—Mo alloy, or the like.

The primary-constituent phase, formed of a metal compound, has a high degree of hardness. The intermediate film 164, formed of the primary-constituent phases joined to each other, thus has a high degree of hardness, and has a higher degree of hardness than the second metal film 166.

The intermediate film 164 is conductive.

The power semiconductor device 100 includes a semiconductor layer 124 and a semiconductor layer 126. In the first preferred embodiment, the semiconductor layer 124 is an $n^+$ semiconductor layer, and the semiconductor layer 126 is a p-type collector layer. The semiconductor layer 124 and the semiconductor layer 126 are disposed above the second main surface 142.

The power semiconductor device 100 includes a second main electrode 128. In the first preferred embodiment, the second main electrode 128 is a collector electrode. The second main electrode 128 is stacked on the semiconductor layers 124 and 126 on the second main surface 142.

1.2 Comparison between Comparative Example and First Preferred Embodiment

Figure 2:
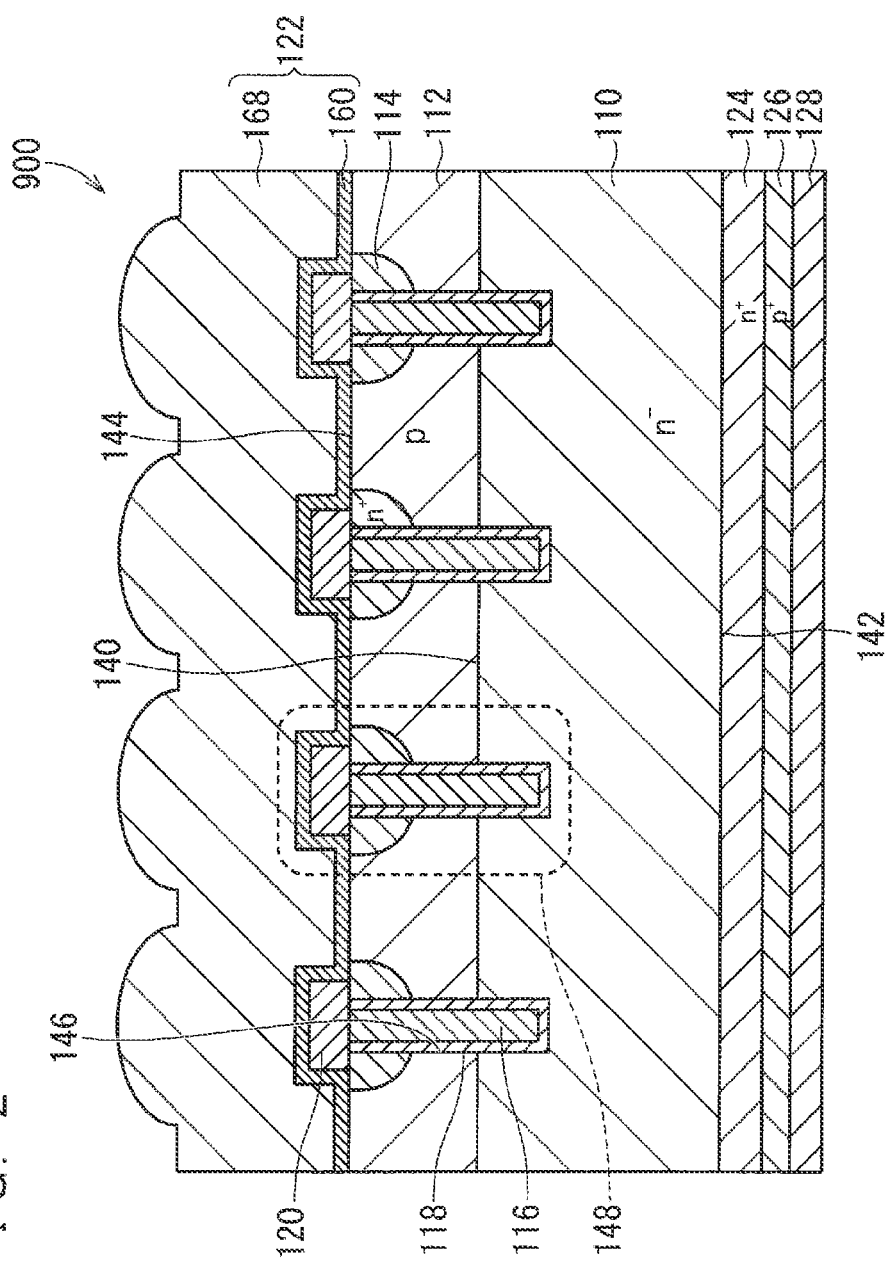
FIG. 2 is a schematic cross-sectional view of a power semiconductor device in a comparative example.

FIG. 2 is a schematic cross-sectional view of a power semiconductor device in a comparative example.

A power semiconductor device 900 in FIG. 2 in the comparative example is different from the power semiconductor device 100 in FIG. 1 in the first preferred embodiment, in the following regard: In the power semiconductor device 100 in the first preferred embodiment, the first main electrode 122 includes the first metal film 162, the intermediate film 164, and the second metal film 166, other than the barrier metal film 160. In the power semiconductor device 900 in the comparative example, by contrast, the first main electrode 122 includes a metal film 168 alone, other than the barrier metal film 160. The metal film 168 is made of metal having an Al concentration greater than or equal to 95 wt %.

In the power semiconductor device 900 in the comparative example, the main electrode 122, when connected to a wire through ultrasonic bonding, can be deformed, thus possibly destroying the elements. For instance, the elements (e.g., the interlayer insulating film 120) in the cell region 148 or the like can be destroyed.

The power semiconductor device 100 in the first preferred embodiment, by contrast, includes the intermediate film 164, which has a higher degree of hardness than the second metal film 166. Consequently, when the wire is connected to the first main electrode 122 through ultrasonic bonding, the power semiconductor device 100 involves a deformation in the second metal film 166, but prevents a deformation in the first metal film 162. The elements (e.g., the interlayer insulating film 120) in the cell region 148 or the like is accordingly less damaged by the wire connection to the first main electrode 122. This sufficiently prevents element breakage that occurs when the wire is connected to the first main electrode 122 through ultrasonic bonding. This also prevents element breakage resulting from a thermal stress that is generated when an outer lead is directly welded to the first main electrode 122 with pressure, or is soldered to the first main electrode 122. That is, the power semiconductor device 100 in the first preferred embodiment prevents element breakage, thus improving its reliability.

The barrier metal film 160 between the plurality of cell regions 148 and the first metal film 162 is made of the aforementioned material. This prevents Si erosion caused by the first main electrode 122, and prevents element breakage caused by Si erosion. This effect is found particularly in the power semiconductor device 100 that has a fine pattern.

2 Second Preferred Embodiment

Figure 3:
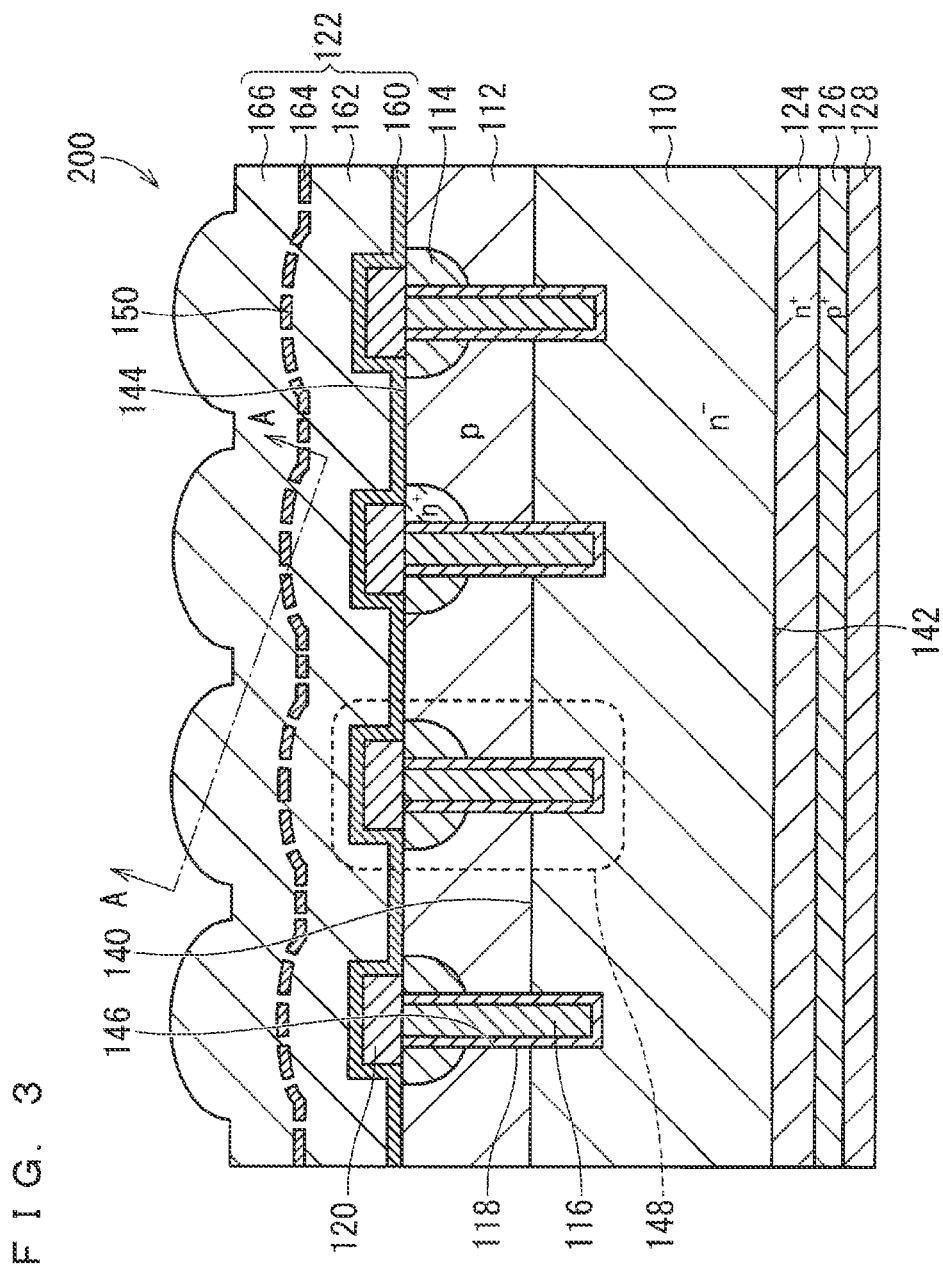
FIG. 3 is a schematic cross-sectional view of a lower semiconductor device in a second preferred embodiment.
Figure 4:
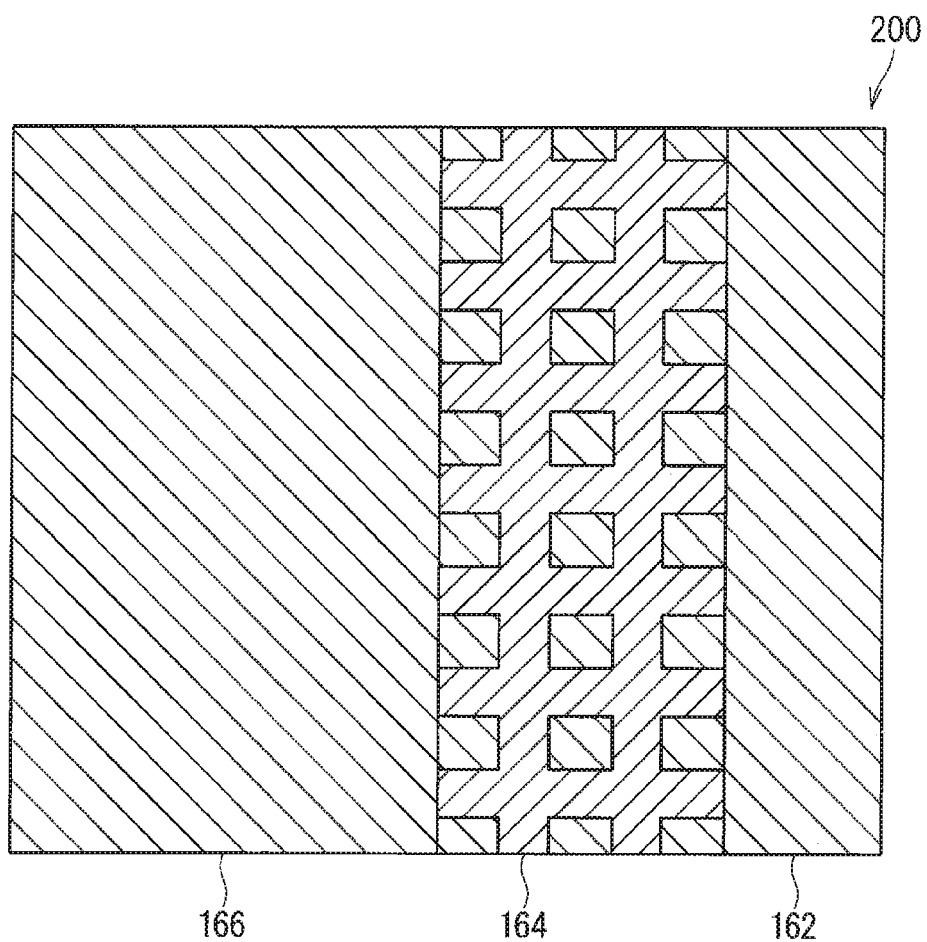
FIG. 4 is a schematic partial cross-sectional view of the power semiconductor device in the second preferred embodiment, in a position denoted by line A-A in FIG. 3.

FIG. 3 is a schematic cross-sectional view of a power semiconductor device in a second preferred embodiment. FIG. 4 is a schematic partial cross-sectional view of the power semiconductor device in the second preferred embodiment, in a position denoted by line A-A in FIG. 3.

A power semiconductor device 200 in FIGS. 3 and 4 in the second preferred embodiment is different from the power semiconductor device 100 in FIG. 1 in the first preferred embodiment, in that the intermediate film 164 is a plane mesh-shaped film.

The power semiconductor device 200 in the second preferred embodiment includes the intermediate film 164 having a higher degree of hardness than the second metal film 166, as with the power semiconductor device 100 in the first preferred embodiment. Consequently, the power semiconductor device 200 prevents element breakage, thus improving its reliability.

In addition, the power semiconductor device 200 in the second preferred embodiment includes the first metal film 162 and the second metal film 166 that are in contact with each other via the openings of the intermediate film 164. This improves the current-carrying capacity of the power semiconductor device 200.

3 Third Preferred Embodiment

FIG. 5 is a schematic cross-sectional view of a power semiconductor device in a third preferred embodiment.

A power semiconductor device 300 in FIG. 5 in the third preferred embodiment is different from the power semiconductor device 100 in the first preferred embodiment, in that the first metal film 162 has a flat main surface 150 on which the intermediate film 164 is disposed. The first metal film 162 can be formed by filling the step between the semiconductor layers 112 and 114 and the interlayer insulating film 120 through high-temperature sputtering of Al, refloating of Al, or the like.

The first metal film 162 of the power semiconductor device 300 in the third preferred embodiment can replace the first metal film 162 of the power semiconductor device in the first or second preferred embodiment.

The power semiconductor device 300 in the third preferred embodiment includes the intermediate film 164 having a higher degree of hardness than the second metal film 166, as with the power semiconductor device 100 in the first preferred embodiment. Consequently, the power semiconductor device 300 prevents element breakage, thus improving its reliability.

In addition, the whole intermediate film 164 of the power semiconductor device 300 in the third preferred embodiment can uniformly receive a stress that is applied to the first main electrode 122 when the wire is connected to the first main electrode 122. Consequently, the elements (e.g., the interlayer insulating film 120) in the cell region 148 or the like are further less damaged by the wire connection to the first main electrode 122. This further prevents element breakage that occurs when the wire is connected to the first main electrode 122 through ultrasonic bonding. This also prevents element breakage resulting from a thermal stress that is generated when the outer lead is directly welded to the first main electrode 122 with pressure, or is soldered to the first main electrode 122.

4 Modification

The power semiconductor devices 100, 200, and 300 in the first, second, and third preferred embodiments are each a trench IGBT. The foregoing technique is also applicable to a vertical power semiconductor device that includes the plurality of cell regions 148, other than a trench IGBT. For instance, the foregoing technique is also applicable to a metal-oxide-semiconductor field-effect transistor (MOSFET). A MOSFET that employs the aforementioned technique includes a source electrode, which is the first main electrode, and a drain electrode, which is the second main electrode.

It is noted that in the present invention, the preferred embodiments can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
a semiconductor substrate having a first main surface and a second main surface disposed opposite the first main surface;
a plurality of cell regions disposed on the first main surface;
a first main electrode disposed over the plurality of cell regions; and
a second main electrode disposed above the second main surface,
wherein the plurality of cell regions each include
a semiconductor layer connected to the first main electrode,
a control electrode, and
an interlayer insulating film covering the control electrode, and electrically insulating the control electrode from the first main electrode, a step being formed between the semiconductor layer and the interlayer insulating film,
the first main electrode includes
a first metal film disposed over the plurality of cell regions, the first metal film being made of metal having an Al concentration greater than or equal to 95 wt %,
an intermediate film disposed on the first metal film, the intermediate film containing primary-constituent phases each of which is formed of a metal compound of at least one kind of element selected from a group consisting of a group 4A element, a group 5A element, and a group 6A element on a long-form periodic table, and at least one kind of element selected from a group consisting of C and N, the intermediate film containing a secondary-constituent phase that is formed of an iron group element and joins the primary-constituent phases to each other,
a second metal film disposed on the intermediate film, the second metal film being made of metal having an Al concentration greater than or equal to 95 wt %, and
a barrier metal film disposed between the first metal film and the plurality of cell regions, the barrier metal film containing primary-constituent phases each of which is formed of a metal compound of at least one kind of element selected from a group consisting of a group 4A element, a group 5A element, and a group 6A element on the long-form periodic table, and at least one kind of element selected from a group consisting of C and N, the barrier metal film containing a secondary-constituent phase that is formed of an iron group element and joins the primary-constituent phases to each other, and
the intermediate film has a higher degree of hardness than the second metal film.

2. The power semiconductor device according to claim 1, wherein the intermediate film is a plane mesh-shaped film.

3. The power semiconductor device according to claim 1, wherein
the first metal film has a main surface on which the intermediate film is disposed, and
the main surface is flat.

4. A power semiconductor device comprising:
a semiconductor substrate having a first main surface and a second main surface disposed opposite the first main surface;
a plurality of cell regions disposed on the first main surface;
a first main electrode disposed over the plurality of cell regions; and
a second main electrode disposed above the second main surface,
wherein the plurality of cell regions each include
a semiconductor layer connected to the first main electrode,
a control electrode, and
an interlayer insulating film covering the control electrode, and electrically insulating the control electrode from the first main electrode, a step being formed between the semiconductor layer and the interlayer insulating film,
the first main electrode includes
a first metal film disposed over the plurality of cell regions, the first metal film being made of metal having an Al concentration greater than or equal to 95 wt %,
an intermediate film disposed on the first metal film, the intermediate film containing primary-constituent phases each of which is formed of a metal compound of at least one kind of element selected from a group consisting of a group 4A element, a group 5A element, and a group 6A element on a long-form periodic table, and at least one kind of element selected from a group consisting of C and N, the intermediate film containing a secondary-constituent phase that is formed of an iron group element and joins the primary-constituent phases to each other, and
a second metal film disposed on the intermediate film, the second metal film being made of metal having an Al concentration greater than or equal to 95 wt %, and
the intermediate film has a higher degree of hardness than the second metal film and is a plane-shaped mesh film, such that the first metal film and the second metal film are in contact with each other via openings in the plane-shaped mesh film.

* * * * *